US006761803B2

(12) United States Patent
Lee et al.

(10) Patent No.: US 6,761,803 B2
(45) Date of Patent: Jul. 13, 2004

(54) LARGE AREA SILICON CONE ARRAYS FABRICATION AND CONE BASED NANOSTRUCTURE MODIFICATION

(75) Inventors: Shuit-Tong Lee, Kowloon (HK); Igor Bello, Kowloon (HK); Chun-Sing Lee, Kowloon (HK); Quan Li, Kowloon (HK); Naigui Shang, Kowloon (HK)

(73) Assignee: City University of Hong Kong, Kowloon (HK)

( * ) Notice: Subject to any disclaimer, the term of this patent is extended or adjusted under 35 U.S.C. 154(b) by 0 days.

(21) Appl. No.: 10/023,418

(22) Filed: Dec. 17, 2001

(65) Prior Publication Data

US 2003/0111336 A1 Jun. 19, 2003

(51) Int. Cl.[7] ................................................ C23C 14/34

(52) U.S. Cl. ............................ 204/192.11; 204/192.34; 204/298.04; 204/298.36

(58) Field of Search ....................... 204/192.11, 192.34, 204/298.04, 298.36

(56) References Cited

U.S. PATENT DOCUMENTS

| | | | | |
|---|---|---|---|---|
| 4,349,424 A | * | 9/1982 | Sovey et al. | 204/192.34 |
| 6,296,740 B1 | * | 10/2001 | Xie et al. | 204/192.11 |

OTHER PUBLICATIONS

Seeger et al., "Fabrication of silicon cones and pillars using rough metal films as plasma etching masks," *Applied Physics Letters*, 74:11, 1627–1629 (March 1999).

Okuyama et al., "Indium phosphide whiskers grown by ion bombardment," *SurfaceScience*, 338, L857–L862 (1995).

Fujimoto et al., "Geometry and structure of sputter–induced cones on nickelseeded silicon," *J. Appl. Phys.*, 77:6, 2725–2734 (Mar. 1995).

Floro et al., "Ion–bombardment–induced whisker formation on graphite," *J. Vac. Sci. Technol.*, 1:3, 1398–1402 (Jul.–Sep. 1983).

Hudson, W.R., "Ion beam texturing," *J. Vac. Sci. Technol.*, 14:1, 286–289 (Jan.–Feb. 1977).

Kiselev et al., "HREM of nanometric tips prepared from epitaxially grown silicon whiskers," *Micron*, 28:1, 21–29 (1997).

Chen et al., "High–density silicon and silicon nitride cones," *J. of Crystal Growth*, 210, 527–531 (2000).

Whitton et al., "The production of regular pyramids on argon ion bombarded surfaces of copper crystals," *Applications of Surface Science*, 1, 408–413 (1978).

Beckey, H.D., "Experimental techniques in field ionisation and field desorption mass spectrometry," *J. Phys. E.* (1979).

* cited by examiner

*Primary Examiner*—Steven VerSteeg
(74) *Attorney, Agent, or Firm*—Merchant & Gould, P.C.

(57) ABSTRACT

A method and an apparatus have been developed to fabricate large area uniform silicon cone arrays using different kinds of ion-beam sputtering methods. The apparatus includes silicon substrate as the silicon source, and metal foils are used as catalyst. Methods of surface modification of the as-synthesized silicon cones for field emission application have also been developed, including hydrofluoric acid etching, annealing and low work-function metal coating. Nano-structure modification based on silicon cones takes advantage of the fact that the cone tip consists of metal/metal siliside, which can be used as catalyst and template for nanowires growth. A method and an apparatus have been developed to grow silicon oxide/silicon nanowires on tips of the silicon cones.

12 Claims, 25 Drawing Sheets

LARGE AREA SILICON CONE ARRAYS FABRICATION AND CONE BASED NANOSTRUCTURE MODIFICATION

FIELD OF THE INVENTION

The present invention relates to the fabrication and further modification of material nano-structures, which have great potential in field emission applications.

BACKGROUND OF THE INVENTION

Since the discovery of cone-like structures on an ion bombarded glow discharge cathode by Guentherschulze and Tollmien (Z. physik 119, p.685, 1942), surface texturing of various materials has aroused great interests. One of the most important applications of the textured surfaces is related to their field emission related properties. Arrays of cones or pyramids have been successfully used in field desorption mass spectroscopy (Beckey et. al, J. Phys. E. 12, p72, 1979). They also have potential to be used as the electron source of ultrahigh vacuum gauges and gas analyzers.

In spite of the above advantages, cone-like arrays have not been used extensively, mainly due to the difficulties which are involved in their production. Various techniques have been used to fabricate the cone-like structures for decades. Beckey et al. (J. Phys. E. 12, p72, 1979) have used a two-step method to grow dense arrays of metallic needle crystals on a cathode of a vacuum diode. However, this method involves a fairly complicated process, and a very limited number of metals can be fabricated this way. Whitton et al. (Appl. Surf. Sci. 1, p408, 1978) have reported copper cone formation after a bombardment dose of $10^{19}$ Ar ions/cm$^2$ during chemical vapor deposition (CVD) growth. This method is fairly effective for most of the metals, however, materials such as silicon and germanium can not be fabricated by this method. Several other growth-induced cone formations have also been reported, including hot filament CVD growth (Chen et al., J. Crystal. Growth, 210, p527, 2000), and Vapor-Liquid-Solid (VLS) technique, in which $SiCl_4$ and $H_2$ are used as the vapor phase (Kiselev et al., Micron 28, p21, 1997). These methods are, however, only effective for one or two types of materials.

Ion beam techniques are widely employed for the purpose of surface texturing. Various materials systems have been investigated (Hudson et al., J. Vac. Sci. Technol., Vol 14, p286, 1977; Floro et al., J. Vac. Sci. Technol., A(1) 3, p1398, 1983; Fujimoto et al., J. Appl. Phys. 77, p2725, 1994; Okuyama et al., Surf. Sci. 338, pL857, 1995). All of them have been able to fabricate the cone-like structures. However, the fabricating area are usually small, the cone-like arrays are not uniform, and the array density is not high. Seeger et al. (Appl. Phy. Lett. 74, p1627, 1999) have developed a method using rough metal films as plasma etching masks, which is able to produce fine silicon cones or pillar-like structures with controllable array density. Their method, however, involves mask-making and the use of poisonous gas such as $SF_6$, which implies increased cost and environmental problems.

SUMMARY OF THE INVENTION

It is the object of the present invention to provide one-step methods for fabricating large area uniform silicon cone arrays with various cone morphologies, cone surface modification for field emission applications, and cone-based nano-structure modifications.

The silicon cone array can be prepared by ion-beam sputtering using an ion source in a high vacuum chamber. Metal catalysts may be provided to enable the cone formation. The substrate and metal catalyst should be arranged in a specific configuration to ensure the uniformity of the as-synthesized cone arrays over a large area. The present invention further provides apparatus for ion-beam synthesis of silicon cone arrays, comprising a high vacuum chamber suitable for ion-beam sputtering, a means for holding a substrate in the chamber and a means for arranging the metal catalyst around the substrate.

The field emission properties of the as-synthesized cone arrays can be improved by several surface modification methods, including acid etching, annealing and low work function metal coating.

Silicon and silicon oxide nanowires can be grown from the tips of individual cones. The nanowires on the tips of the cones can be prepared using a hot filament chemical vapor deposition chamber. Argon is used as a protective gas, and hydrogen is used as reductive gas in order to achieve the silicon nanowires. The present invention provides apparatus for nanowire growth, comprising a chemical vapor deposition chamber, means for holding a substrate in the chamber, and means for supporting one or more filaments in the chamber. The deposition time is strictly controlled to enable one nanowire-one cone tip relationship.

BRIEF DESCRIPTION OF THE DRAWINGS

Some embodiments of the invention will now be described by way of example and with reference to the accompanying drawings, in which.

DESCRIPTION OF THE PREFERRED EMBODIMENTS

Figure 1:
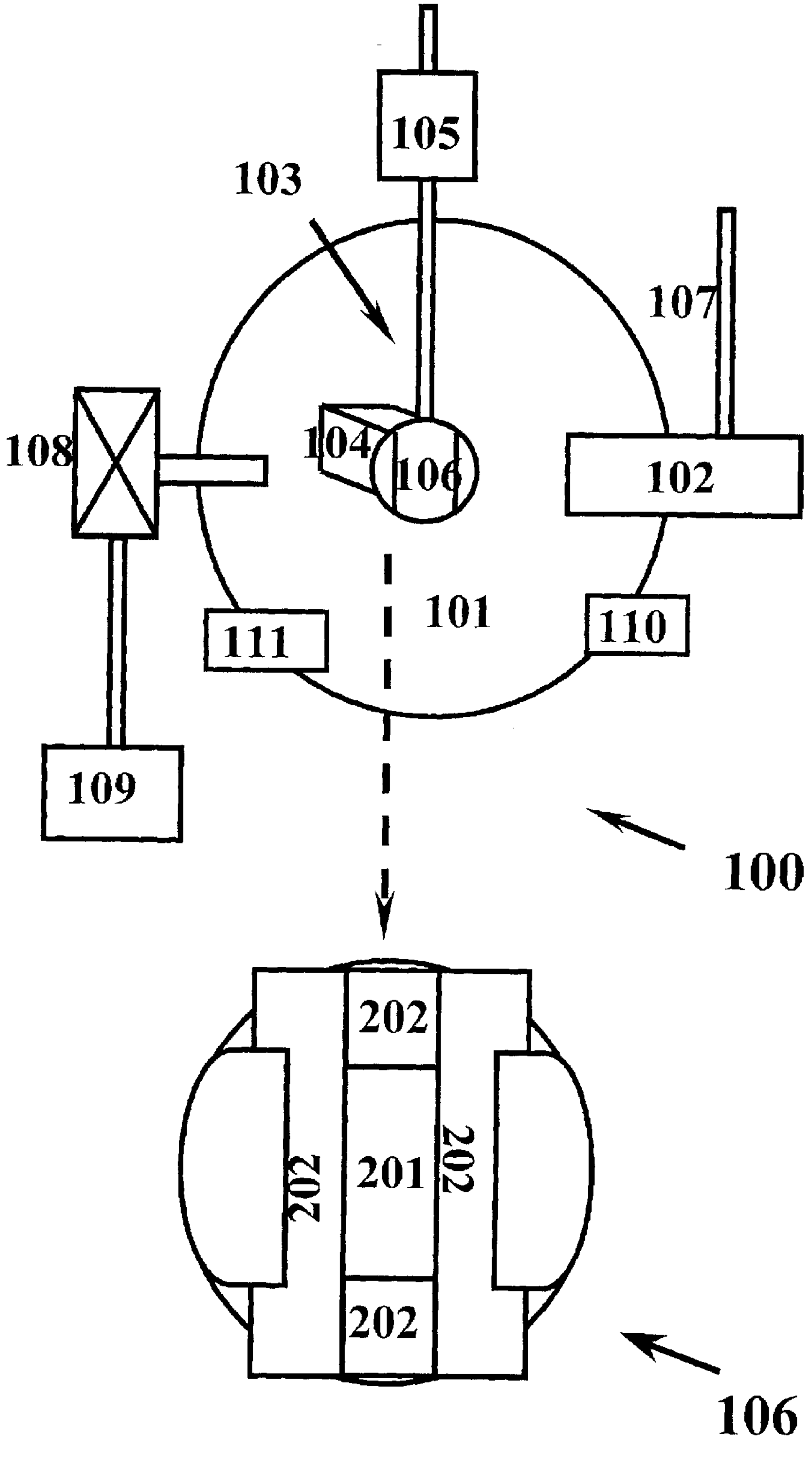
FIG. 1 is a schematic diagram of the apparatus according to an embodiment of the present invention.

Referring to FIG. 1, an ion-beam deposition reactor 100 is shown. Reactor 100 consists of a high vacuum chamber 101; an ion source 102, which can be either a rf ion source or a Kaufman gas ion source; a substrate holder 103 for supporting the substrate and the metal catalysts, and a halogen lamp 104 for substrate heating. The substrate holder 103 consists of a multifunctional feed-through 105 and a holder clamp 106. The multifunctional feed-through 105 makes the substrate holder rotable so that the incident angle of the ion beam can be varied from 0 to 90 degree. The holder clamp 106 can be made of various metals consistent with the metal catalysts used, preferably nickel, molybdenum and tungsten.

The ion-beam reactor 100 further comprises an inlet 107 for a sputtering gas, which is circulated through the chamber 101 by a turbo-molecular pump 108 and a mechanical pump 109. An ion gauge 110 and a cold cathode gauge 111 are provided for monitoring the pressure of the sputtering gas in chamber 101.

A suitable silicon substrate 201 is mounted in the center of the substrate holder clamp 106. The metal catalyst 202, which can be nickel, molybdenum, tungsten etc., is shaped into thin flat foil and mounted around the substrate 201. Silicon substrate is used in the present invention in order to achieve silicon cone arrays. Other materials such as germanium, copper, graphite, and the like, can be used as the substrate to obtain cones made of the respective substrate of germanium, copper or graphite.

The fabrication of cone arrays is carried out by argon ion sputtering, while the argon ions are generated from the ion source. The argon gas pressure is controlled at $2\times10^{-4}$ Torr. Argon is one possible sputtering gas that may be used with the present invention, other gases such as helium, neon, xenon, or hydrogen etc. are equally possible. The ion energy used in the present invention ranges from 100 eV to 1000 eV. The incident angle of the ion-beam varies from 0 to 90 degree, the substrate temperature varies from 100 C. to 600 C., and the fabrication time varies from 30 minutes to 4 hours for each individual process.

The formation of the cone structures probably involves the following process: Metal catalysts are sputtered off from the bulk materials and re-deposited onto the silicon substrate, forming a certain alloy with the substrate material. The alloy is relatively stable to ion-sputtering, therefore protects the substrate material underneath from ion etching and leads to the cone steady-state evolution. As a result, large area uniform cone arrays are formed, with the individual cone consisting of a cone body made of the substrate material and a cone head made of the metal catalyst and metal/substrate alloys.

Surface modification of the as-synthesized cone for field emission applications can be done in several ways. As an example, the as-synthesized Si cones on a Si substrate can be dipped into 5% hydrofluoric (HF) acid upside down for 3 minutes, using plastic tweezers and a clamp. As silicon and silicon oxide are etched away, other impurities on the cone surface fall into the hydrofluoric acid as well, resulting in a fine cone tip and clean cone surface. A 5% concentration is used with the present embodiment of the invention, HF acid at other concentrations (1%–48%) can be equally effective. The etching time can be different from sample to sample, usually in the range of 10 seconds to 10 minutes. Acid mixtures of HF, $HNO_3$, HCl, or $H_2SO_4$ are equally possible for the same purpose as stated in the present invention.

Annealing under ultra-high vacuum conditions is another possible method for cone surface modification in the present invention. The annealing temperature ranges from 100° C. to 800° C., and the annealing time is between 10 to 30 minutes. An ultra-high vacuum chamber is required for this method.

Another effective method for cone surface modification is low work function material coating on the cone surface. Cesium is chosen to be deposited on the cone surface in the present embodiment of the invention. Other low work function metals are possible for the different samples. For the deposition of Cesium, an ultrahigh vacuum chamber is required. The thickness of the Cesium layer ranges from 10–100 angstroms.

Figure 2:
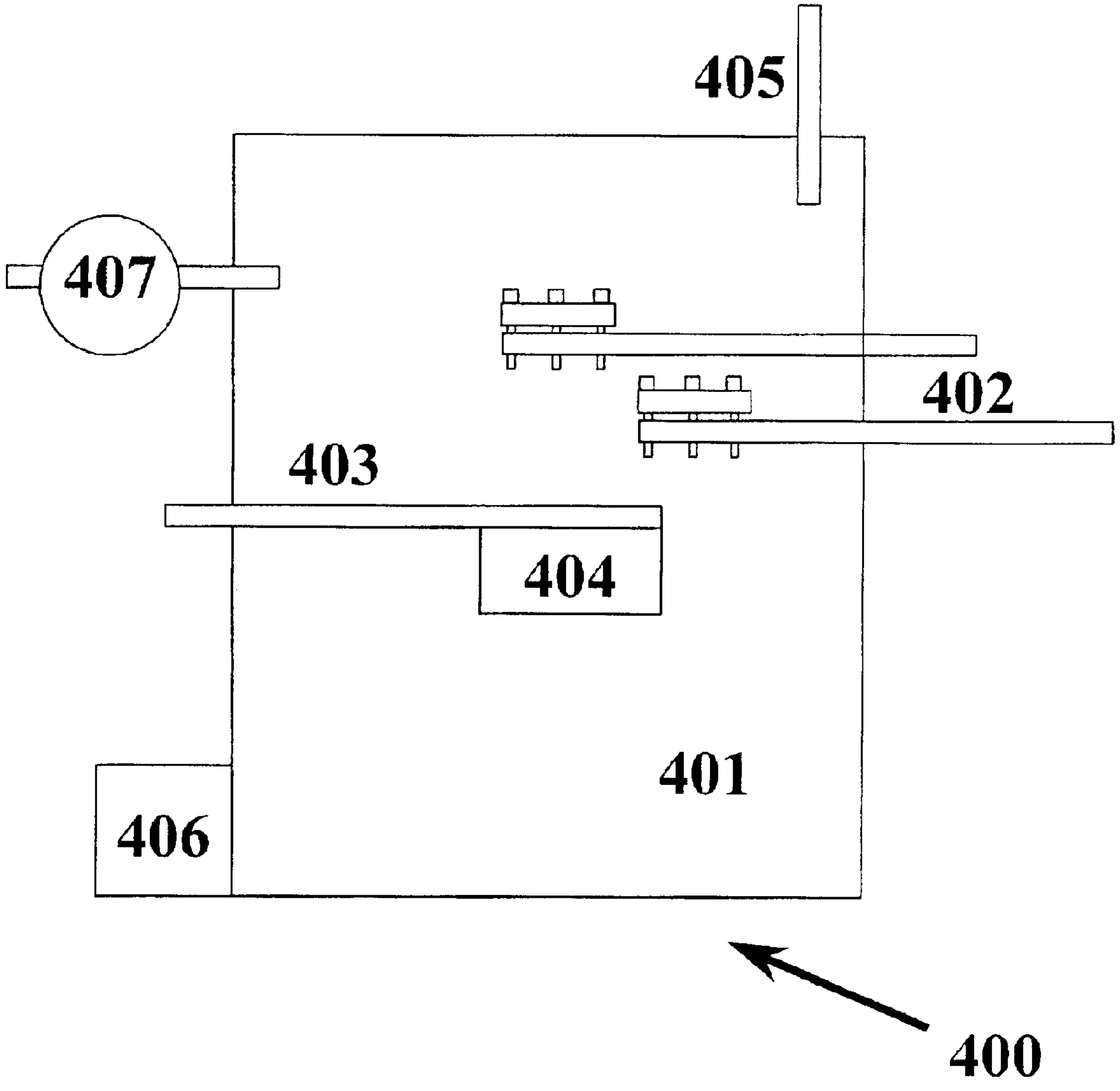
FIG. 2 is a schematic diagram of the apparatus according to an embodiment of the present invention.

Turning to FIG. 2, a chemical vapor deposition (CVD) reactor 400 is shown. Reactor 400 consists of a CVD chamber 401, two feed-throughs 402 for supporting one or more filaments, a substrate holder 403 for supporting the substrate, and a heater 404 for substrate heating. The CVD reactor 400 further comprises an inlet 405 for protective or reductive gas, which is passed through chamber 401 by means of pump 406. A pressure gauge 407 is provided for monitoring the pressure of the reactant gas in the chamber 401.

The growth of the silicon oxide nanowires on the tips of the cones is realized at a pressure of 15–25 Torr and 900–950° C. substrate temperatures for 5–10 minutes. The protective gas used in the present embodiment of the invention is argon, though other inert gas such as helium, neon, and xenon are equally possible. The growth of silicon nanowires is achieved by adding hydrogen gas, which probably decomposes to atomic H near the hot filament at temperatures higher than 1800° C. The atomic hydrogen acts as a reductant to prevent the growing silicon nanowires from oxidation. The ratio between argon and hydrogen is 9 to 1 in the present embodiment of the invention, though other gas ratios can be equally effective. CVD using hot filament excitation techniques is one possible technique that may be used with the present invention, others such as microwave, rf or dc plasma source are as well effective.

EXAMPLES

The following examples are presented for a further understanding of the invention.

Example A

The silicon cone array for this sample was prepared in the apparatus shown in FIG. 1. Mirror polished silicon was used as the substrate. Nickel was used as the metal catalyst. The substrate temperature was maintained at 550° C. Argon was used as the sputter gas and the total pressure was kept at $2\times10^{-4}$ Torr. The ion energy was chosen at 900 eV and ion-current was 40 mA. The angle between the center ion-beam and the substrate surface normal is kept at 20 degree. The ion-sputtering time is 120 minutes.

Figure 3:
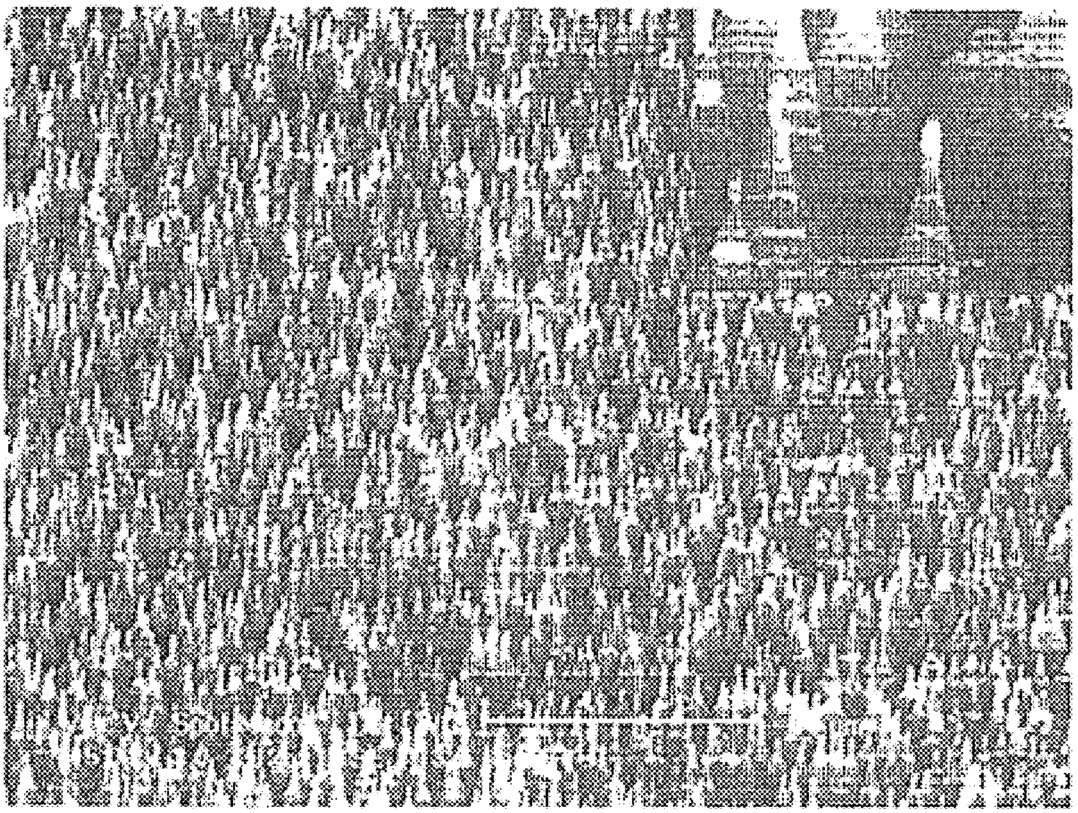
FIG. 3 is a scanning electron microscope (SEM) micrograph of the silicon cone arrays, corresponding to example A.
Figure 4:
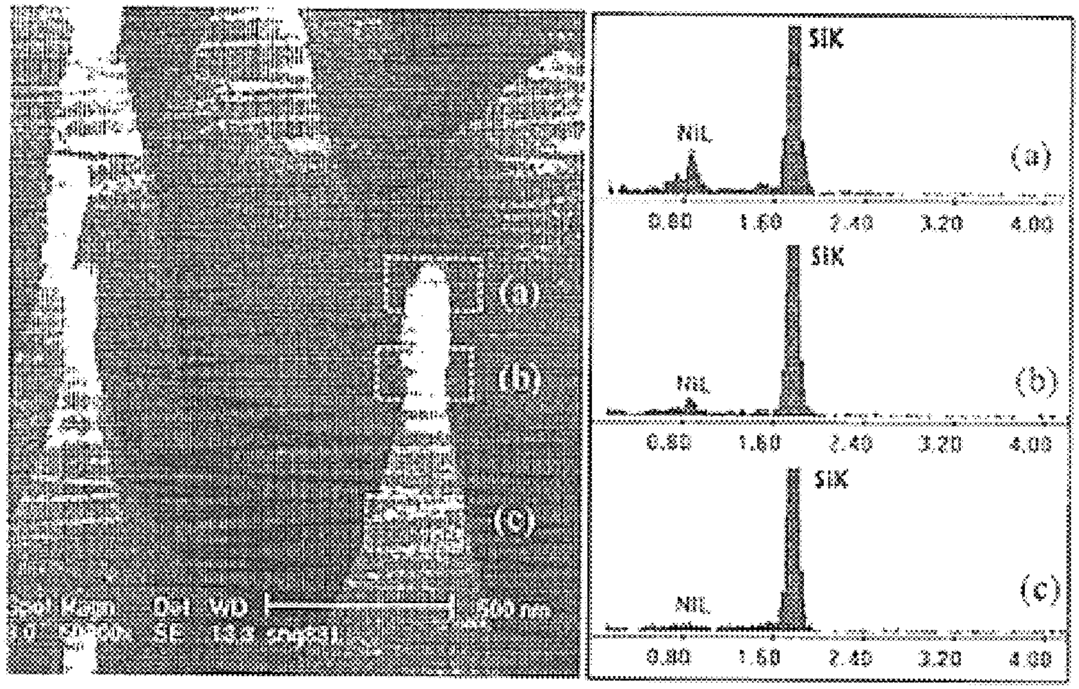
FIG. 4 is an energy dispersed x-ray (EDX) spectrum corresponding to the silicon cone image inserted in the left, which is taken from FIG. 3.
Figure 5:
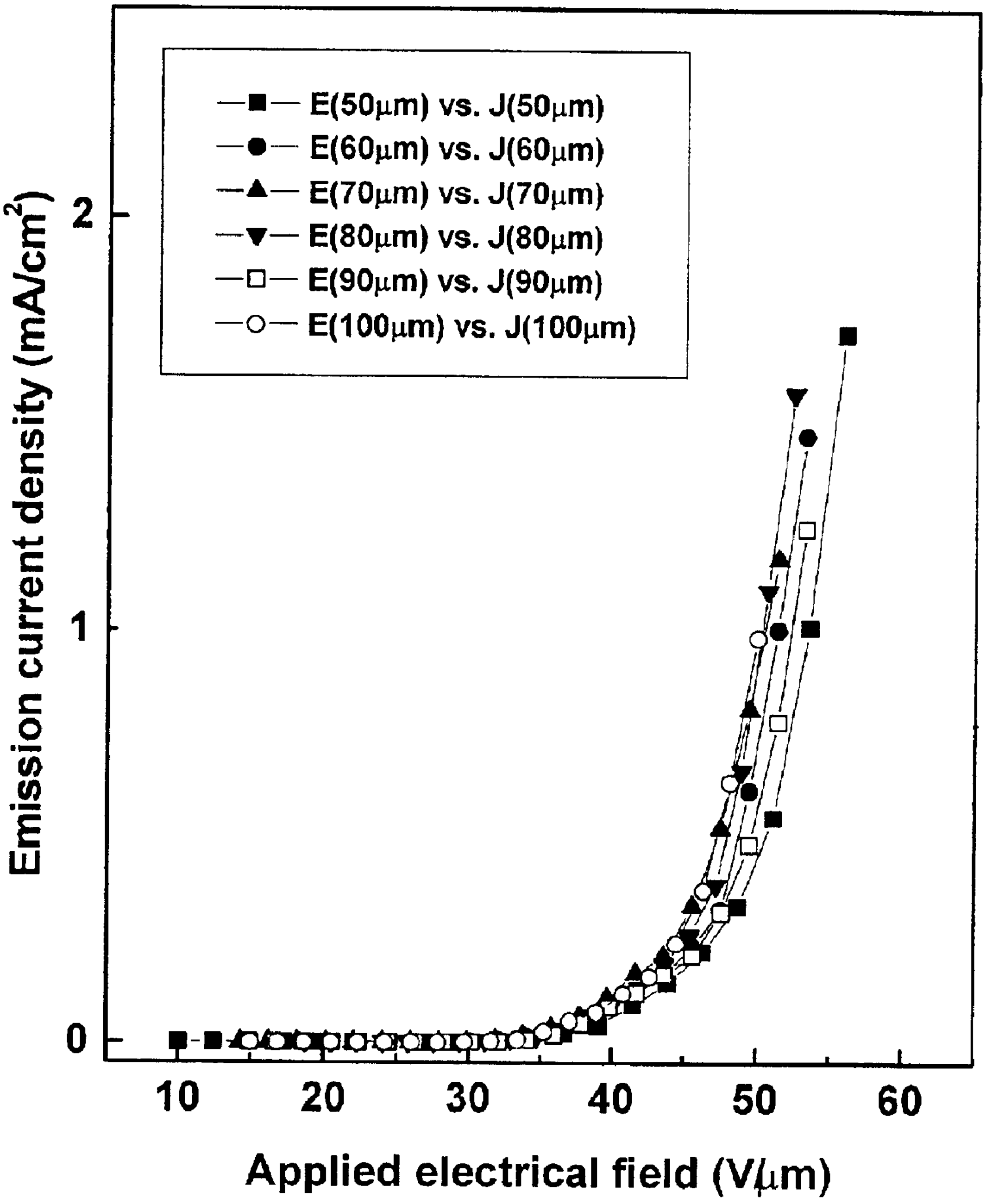
FIG. 5 is a current-voltage (I–V) plot of the silicon cones shown in FIG. 3.

Scanning Electron Microscopy (SEM) micrographs of the above sample are shown in FIG. 3. The 1 cm×2 cm silicon substrate is covered with uniform silicon cone arrays. The density of the cones is measured as $10^8/cm^2$. The height of each cone is up to several microns and the lateral size of the cone tip ranges from tens of nanometers to hundreds of nanometers. The contrast of the cone body and cone tip appears to be different, suggesting different chemical contents. Energy-dispersed x-ray (EDX) microanalysis shows that the cone body is composed of silicon and the cone tip is composed of silicon and nickel (FIG. 4). FIG. 5 shows the current-voltage (I–V) characteristics plot of the as-synthesized sample. The turn-on field, which is defined as the electric field leading to a current density of 0.01 $mA/cm^2$, is 34V/$\mu$m.

Example B

The silicon cone array for this sample was prepared under the same experimental conditions as example A, except that tungsten was used as the metal catalyst.

Figure 6:
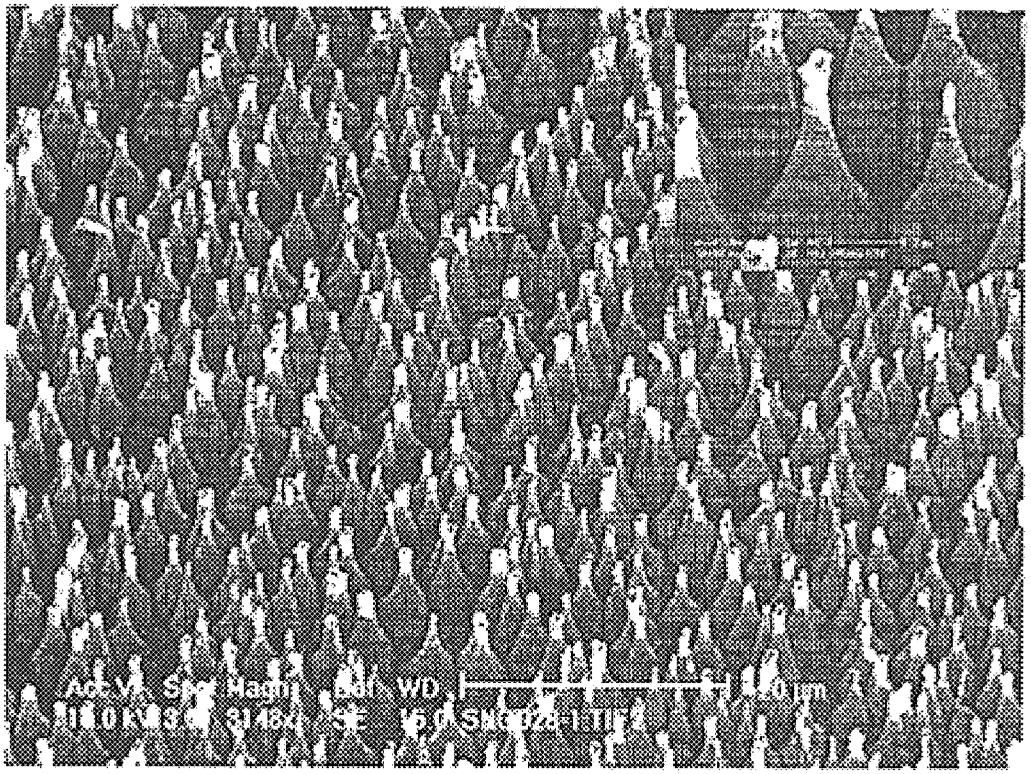
FIG. 6 is a SEM micrograph of the silicon cone arrays, corresponding to example B.
Figure 7:
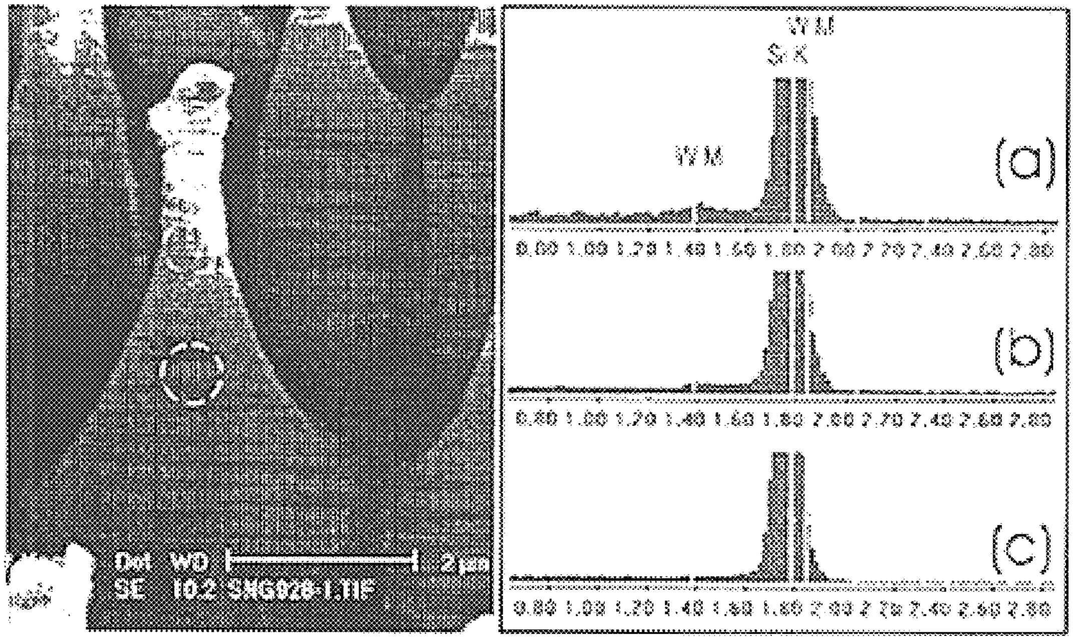
FIG. 7 is an EDX spectrum corresponding to the silicon cone image inserted in the left, which is taken from FIG. 6.

SEM micrographs of the above sample are shown in FIG. 6. The 1 cm×2 cm silicon substrate is covered with uniform silicon cone arrays. The density of the cones is measured as $10^8/cm^2$. The height of each cone is up to several microns and the lateral size of the cone tip ranges from tens of nanometers to hundreds of nanometers. The contrast of the cone body and cone tip appears to be different, suggesting different chemical contents. EDX microanalysis shows that the cone body is composed of silicon and the cone tip is composed of silicon and tungsten (FIG. 7).

Example C

The silicon cone array for this sample was prepared under the same experimental conditions as example A, except that molybdenum was used as the metal catalyst.

Figure 8:
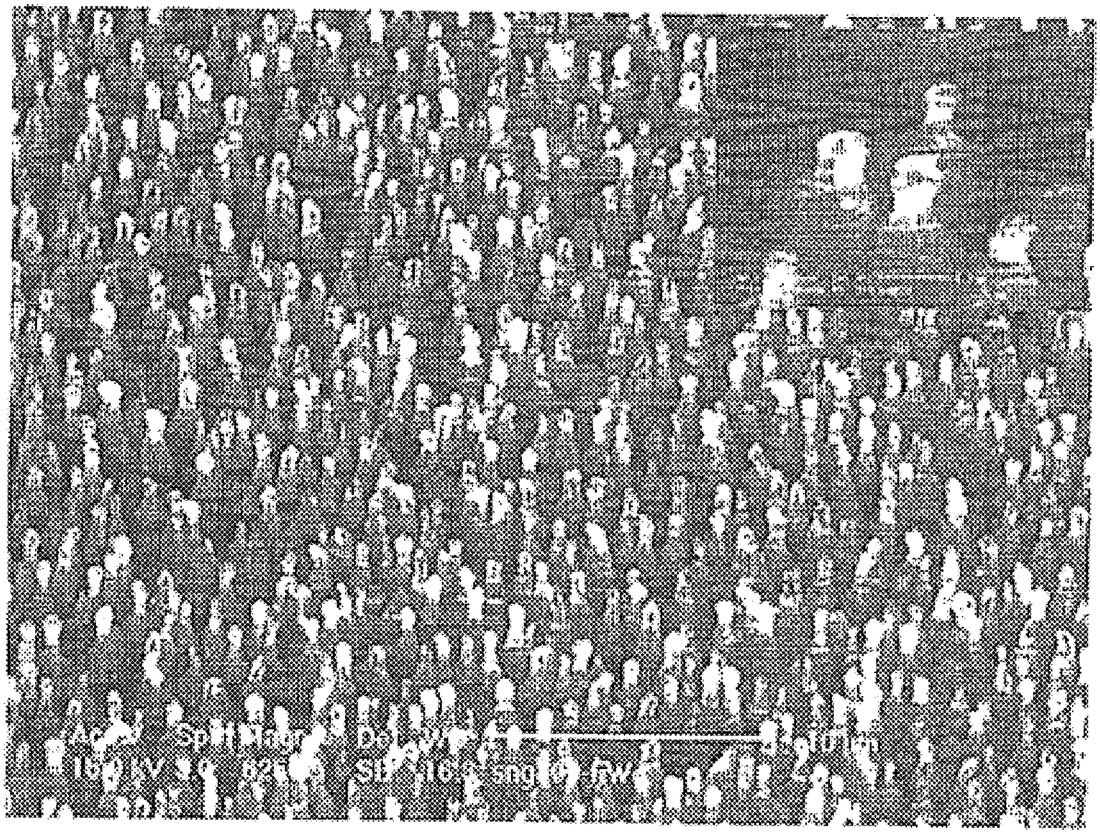
FIG. 8 is a SEM micrograph of the silicon cone arrays, corresponding to example C.
Figure 9:
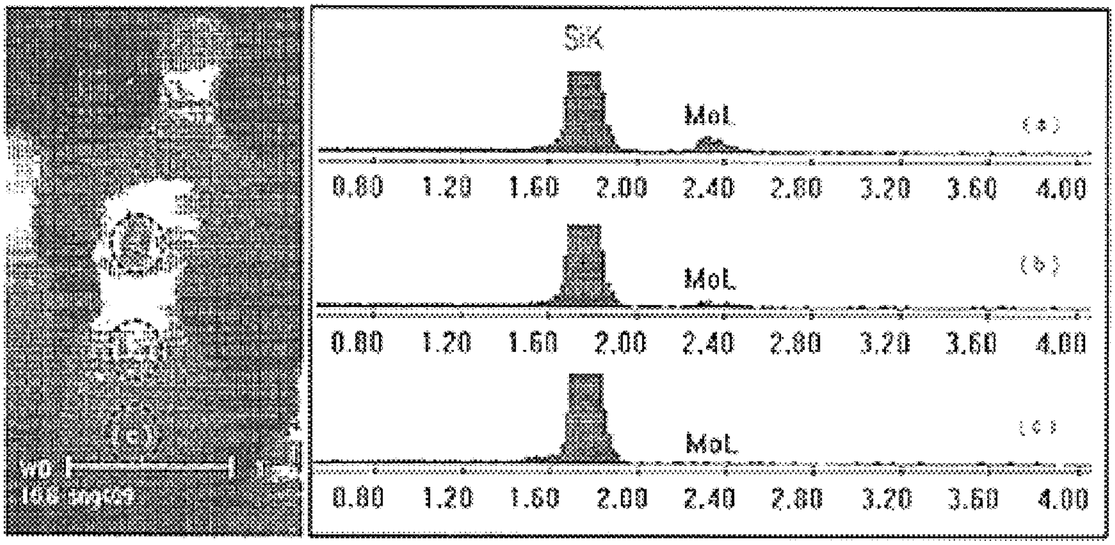
FIG. 9 is an EDX spectrum corresponding to the silicon cone image inserted in the left, which is taken from FIG. 8.
Figure 10:
FIG. 10 is a transmission electron microscopy (TEM) image of one silicon cone, corresponding to example C.
Figure 11:
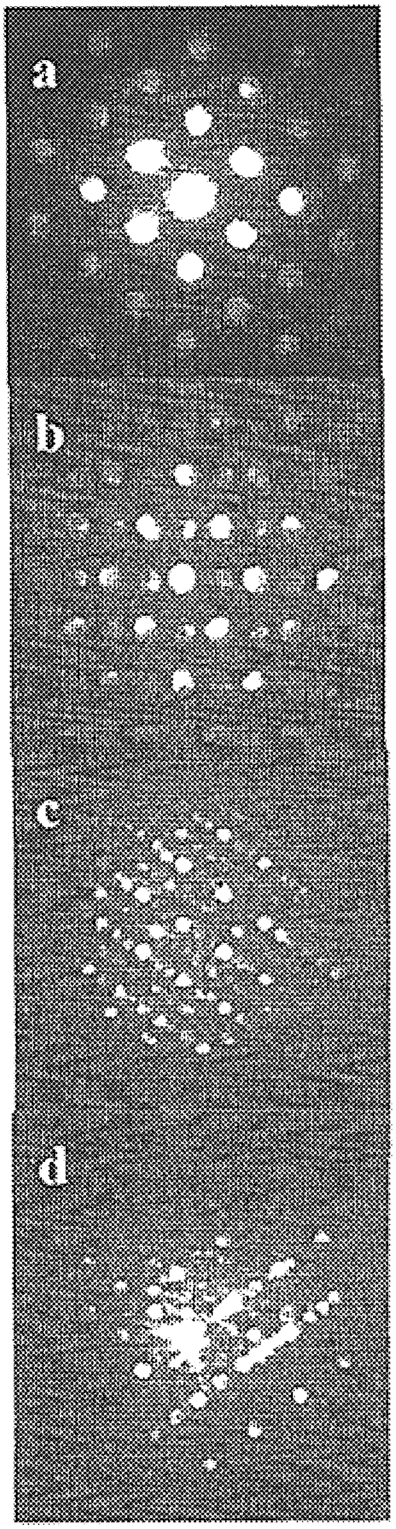
FIG. 11 is a transmission electron diffraction (TED) pattern of the silicon cone shown in FIGS. 10, (*a*), (*b*), (*c*) and (*d*) corresponds to areas marked in FIG. 10.

SEM micrographs of the above sample are shown in FIG. 8. The 1 cm×2 cm silicon substrate is covered with uniform silicon cone arrays. The density of the cones is measured as $10^8/cm^2$. The height of each cone is up to several microns and the lateral size of the cone tip ranges from tens of nanometers to hundreds of nanometers. The contrast of the cone body and cone tip appears to be different, suggesting different chemical contents. EDX microanalysis shows that the cone body is composed of silicon and the cone tip is composed of silicon and molybdenum (FIG. 9). Transmission electron microscopy (TEM) image shows different contrast of the cone body and cone tip (FIG. 10). Micro diffraction in FIG. 11 confirms that the cone body is single crystalline silicon (11*a*). The cone tip consists of several different material/material structures (11*b,c,d*): a silicon/molybdenum superlattice is observed right on top of the single crystalline silicon cone body, followed a polycrystalline molybdenum silicide, on top of which is a small amount of molybdenum metal.

Example D

The silicon cone array for this sample was prepared under the same experimental conditions as example A, except that the angle between the center ion-beam and the substrate surface normal is 40 degree.

Figure 12:
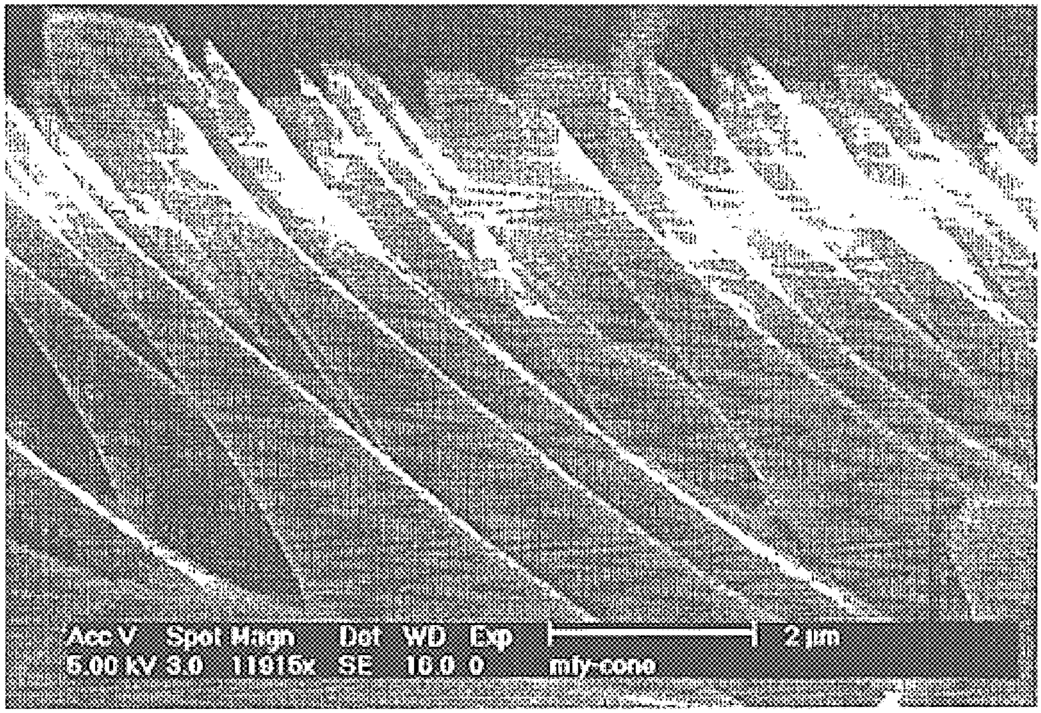
FIG. 12 is a cross-sectional SEM micrograph of silicon cone arrays, corresponding to example D.
Figure 13:
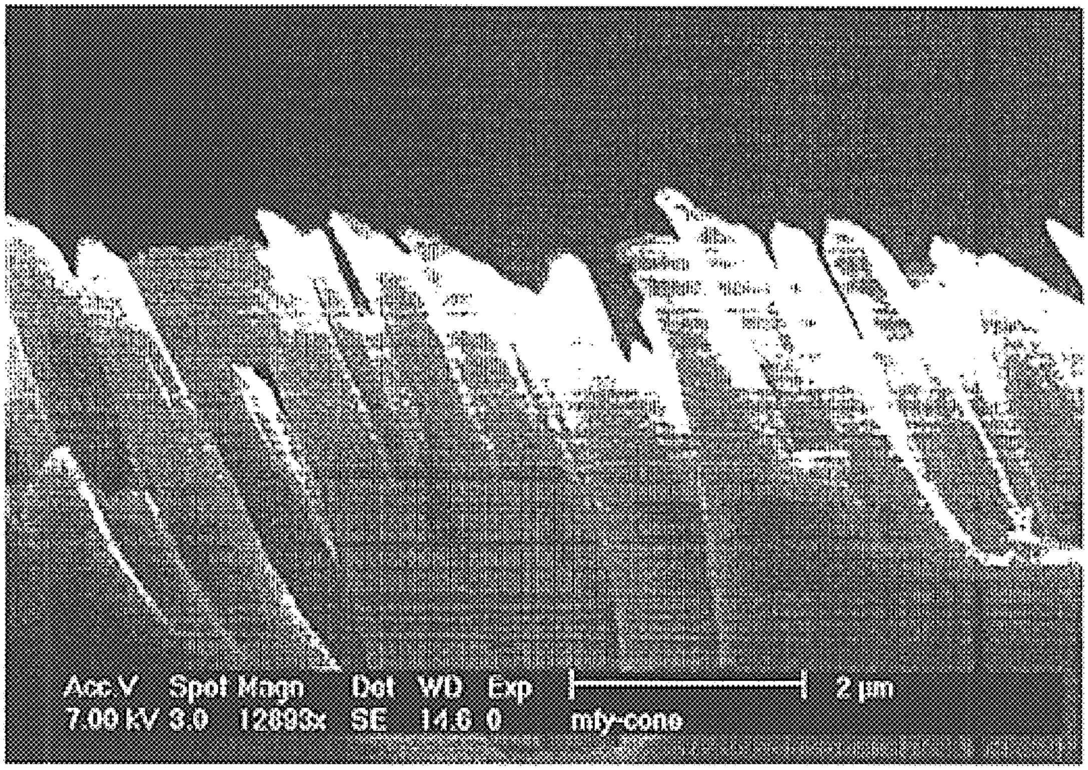
FIG. 13 is a cross-section SEM micrograph of the silicon cone arrays, corresponding to example A.

Cross-sectional SEM micrograph in FIG. 12 shows that the height of the cone is measured at ~6 microns, compared to that of example A (FIG. 13), which is measured as 4 microns, although their deposition time is the same.

Example E

The silicon cone array for this sample was prepared under the same experimental conditions as example A, except that the substrate temperature is controlled at 400° C.

Figure 14:
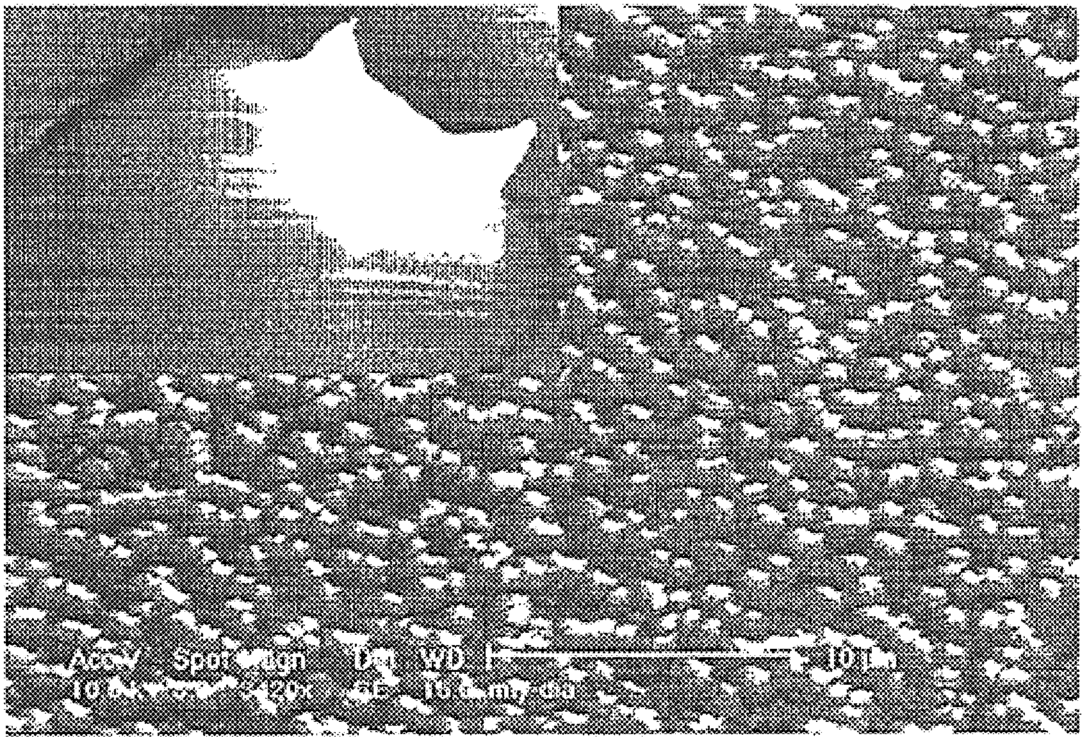
FIG. 14 is a SEM micrograph of the silicon cone arrays, corresponding to example E.
Figure 15:
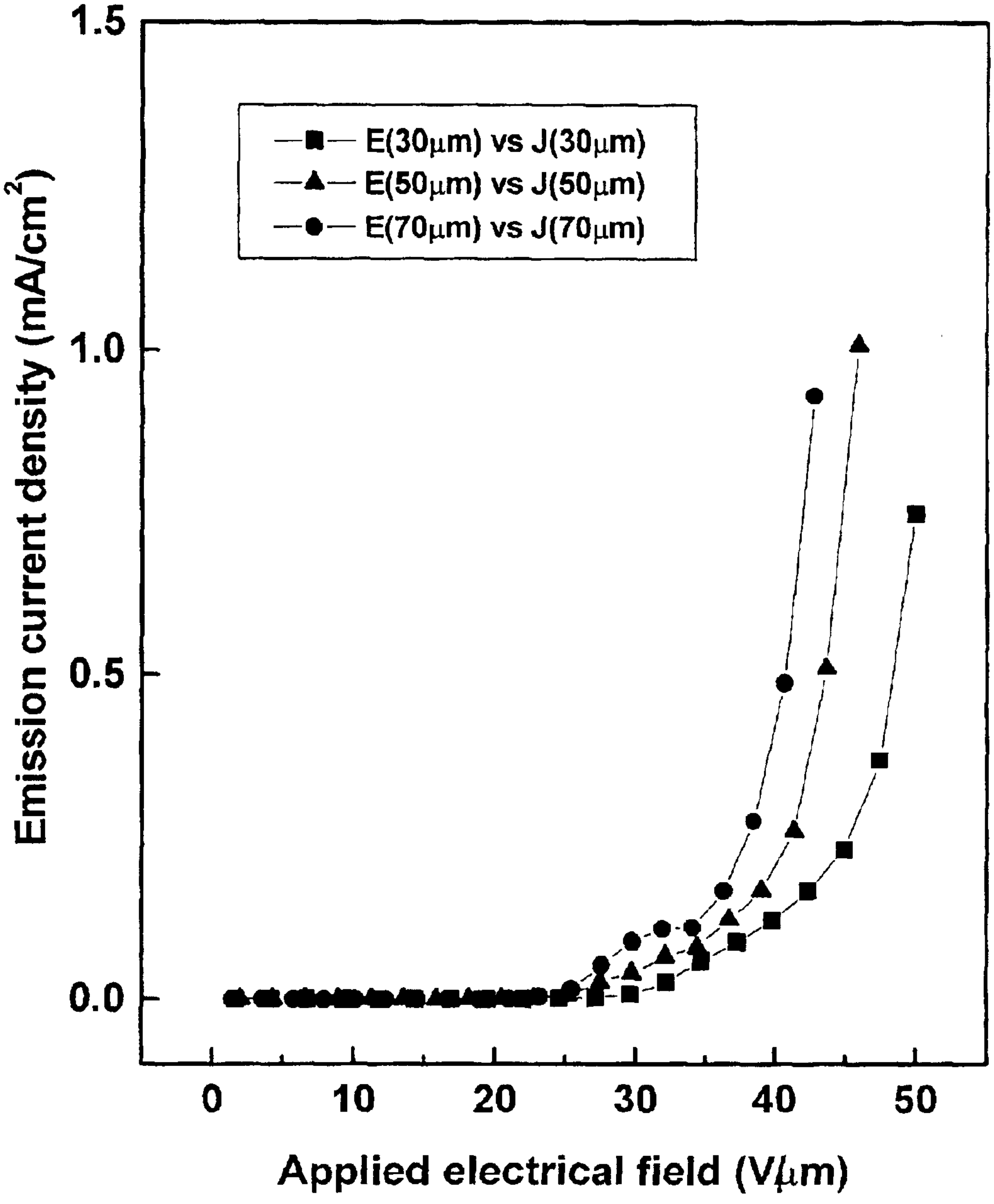
FIG. 15 is a I–V plot of the silicon cones shown in FIG. 14.

SEM micrographs of the above sample are shown in FIG. 14. The morphology of the cone in this sample is similar to that of example A, however, instead of single tip for each cone, double tip is observed. The contrast of the cone body and cone tip appears to be different and EDX microanalysis shows that the cone body is composed of silicon and the cone tip is composed of silicon and nickel. FIG. 15 shows the current-voltage (I–V) characteristics plot of the as-synthesized sample. The turn-on field is 27V/$\mu$m.

Example F

The silicon cone array for this sample was prepared under the same experimental conditions as example A, except that the substrate temperature is controlled at 100° C.

Figure 16:
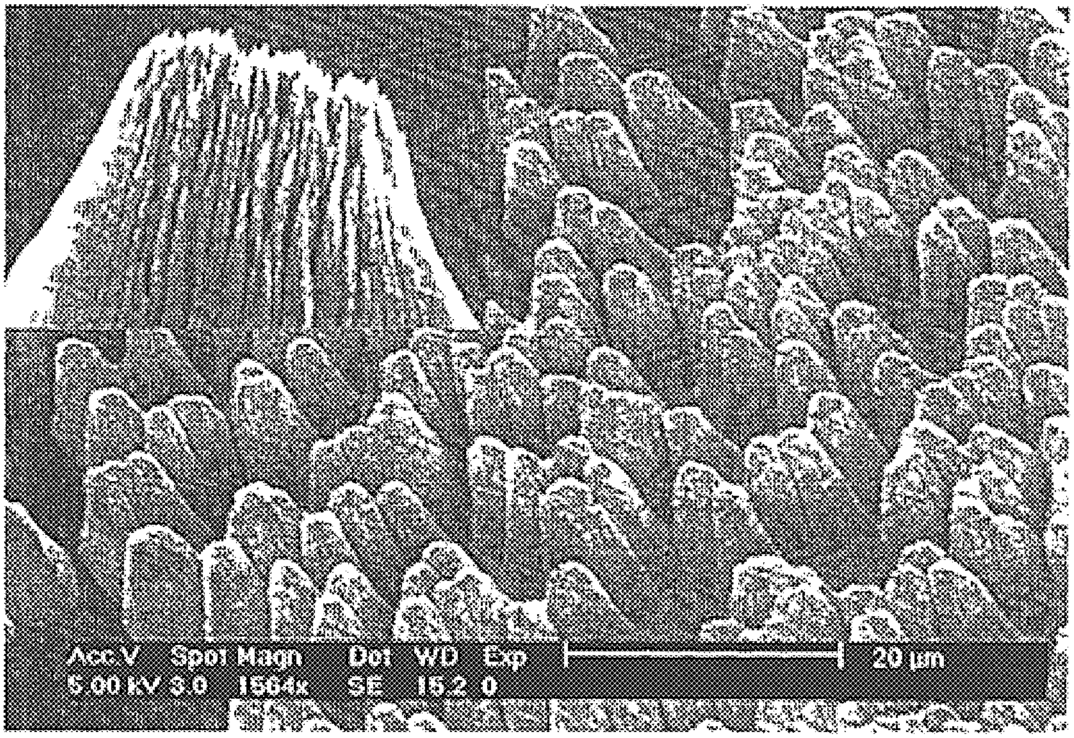
FIG. 16 is a SEM micrograph of the silicon cone arrays, corresponding to example F.
Figure 17:
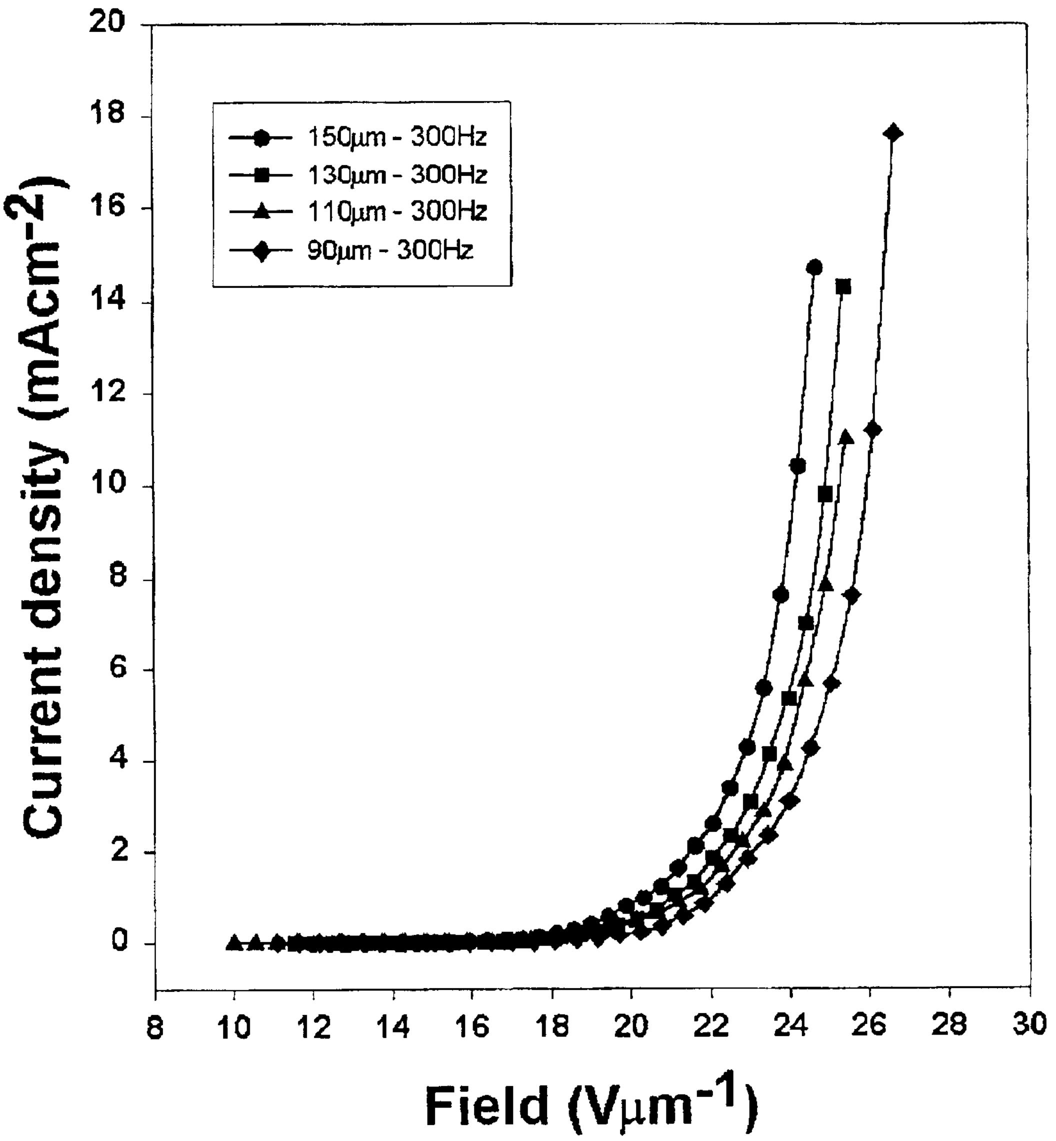
FIG. 17 is a I–V plot of the silicon cones shown in FIG. 16.

SEM micrographs of the above sample are shown in FIG. 16. The morphology of the cone in this sample is similar to that of example A, however, instead of single tip for each cone, a multiple tip is observed. The contrast of the cone body and cone tip appears to be different and EDX microanalysis shows that the cone body is composed of silicon and the cone tip is composed of silicon and nickel. FIG. 17 shows the current-voltage (I–V) characteristics plot of the as-synthesized sample. The turn-on field is 18V/$\mu$m.

Example G

Figure 18:
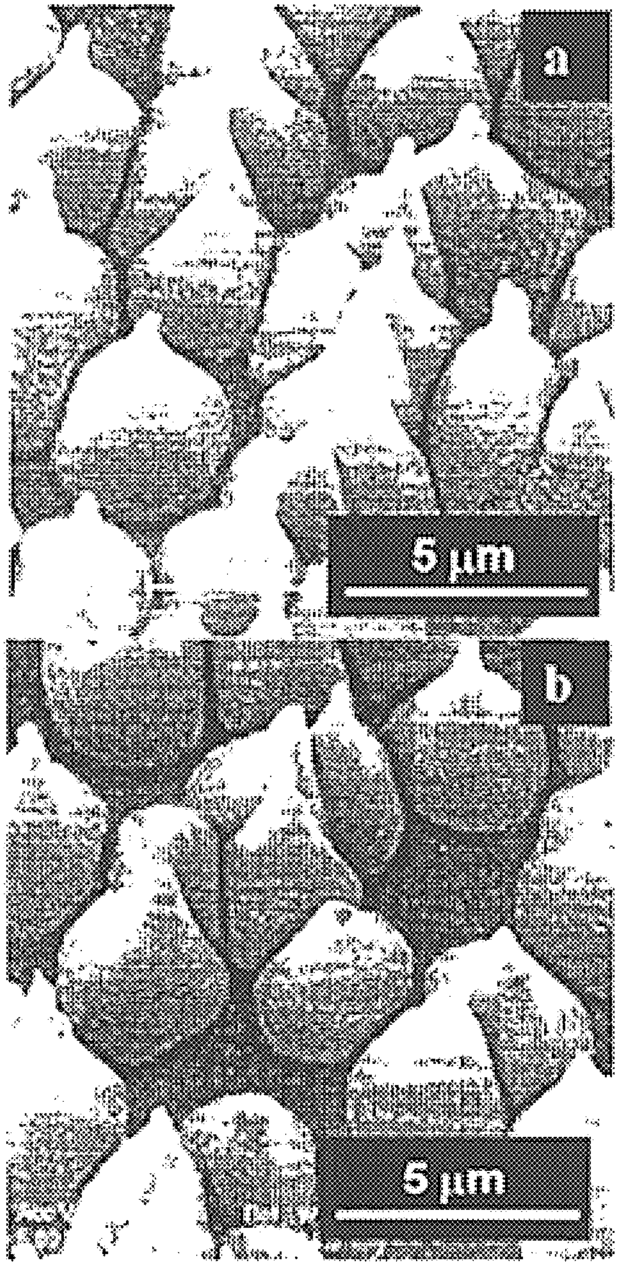
FIG. 18 is a SEM micrograph of the silicon cone arrays, corresponding to example G, (a) as-synthesized cones; (b) cones after hydrofluoric etching for 3 minutes.
Figure 19:
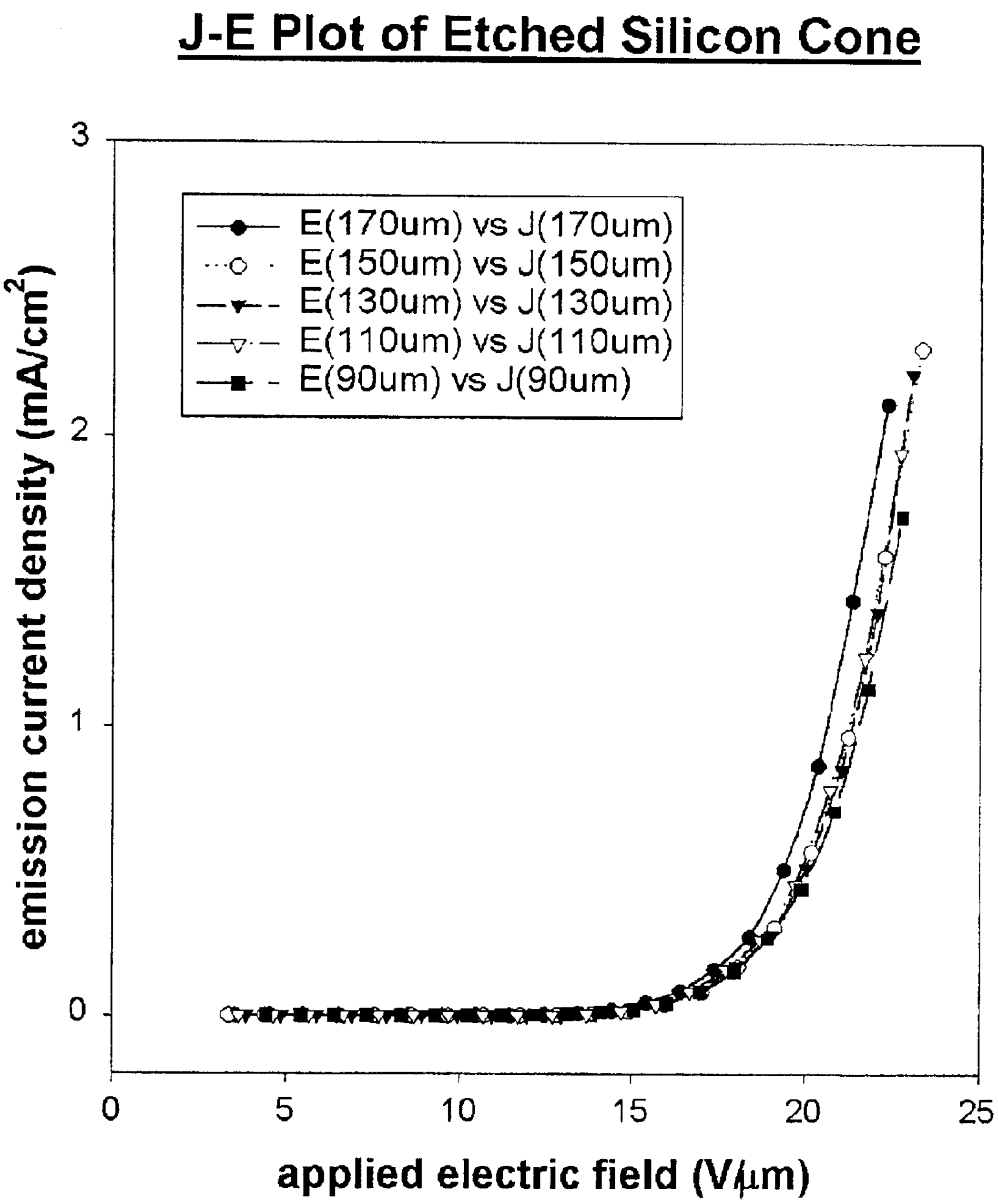
FIG. 19 is a I–V plot of the silicon cones shown in FIG. 17(*b*)

In this example, the silicon cone array in example A was etched by hydrofluoric acid (HF). SEM micrograph (FIG. 18) shows the enlarged cone structures before (18*a*) and after (18*b*) the etching process. Fine cone tips with reduced lateral size are observed after HF etching. FIG. 19 shows the current-voltage (I–V) characteristics plot of the HF-etched sample. The turn-on field is 14V/$\mu$m, which is considerably smaller than (34V/$\mu$m) for the non-etched sample. In addition, time stability test at an emission current density of about 35 $mA/cm^2$ and over 15 hrs. shows no degradation of emission properties except for small fluctuations in current density.

Example H

Figure 20:
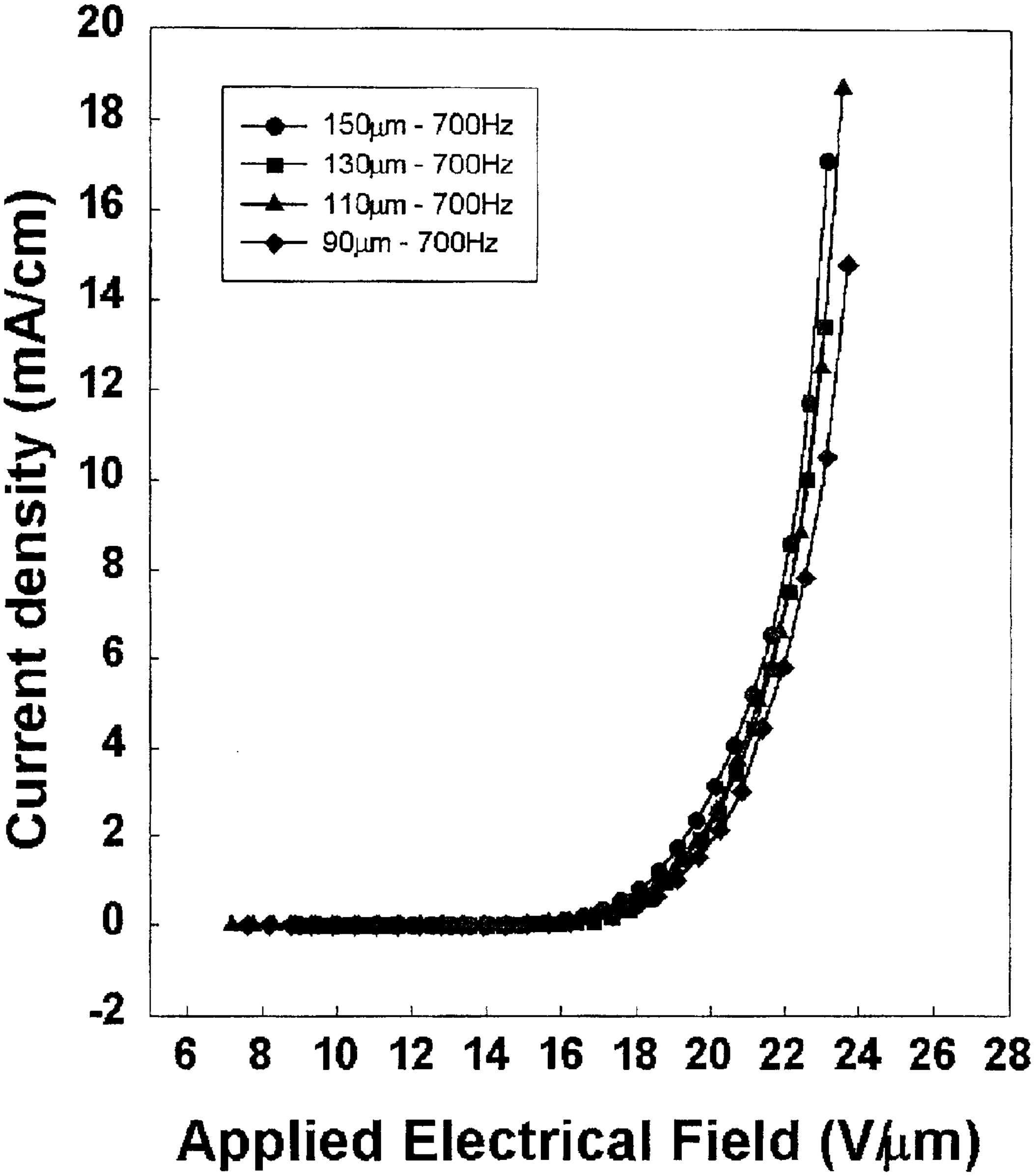
FIG. 20 is a I–V plot of the silicon cones, corresponding to example H.

In this example, a low function metal-Cesium, was deposited on the silicon cone array in example F. FIG. 20 shows the current-voltage (I–V) characteristics plot of the as-synthesized sample. The turn-on field is considerably smaller at 13V/$\mu$m.

Example I

In this example, the sample in example A was put into a hot filament CVD chamber. Argon was introduced as protective gas atmosphere. The total pressure was maintained at 20 Torr during the growth process. The sample was heated up to 950° C. for 5 minutes and then naturally cooled down.

Figure 21:
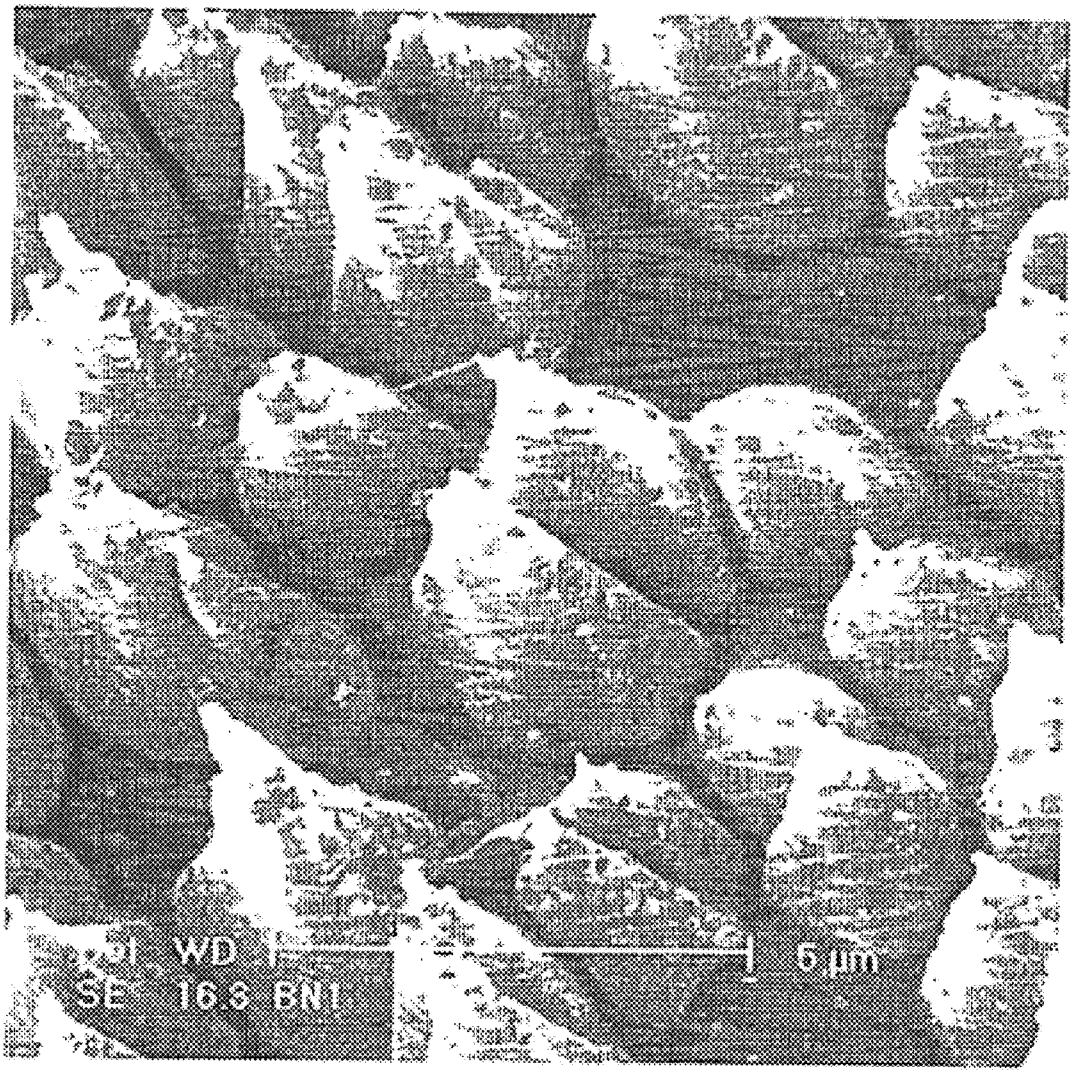
FIG. 21 is a SEM micrograph of a silicon oxide nanowire grown on the tip of a silicon cone, corresponding to example I.
Figure 22:
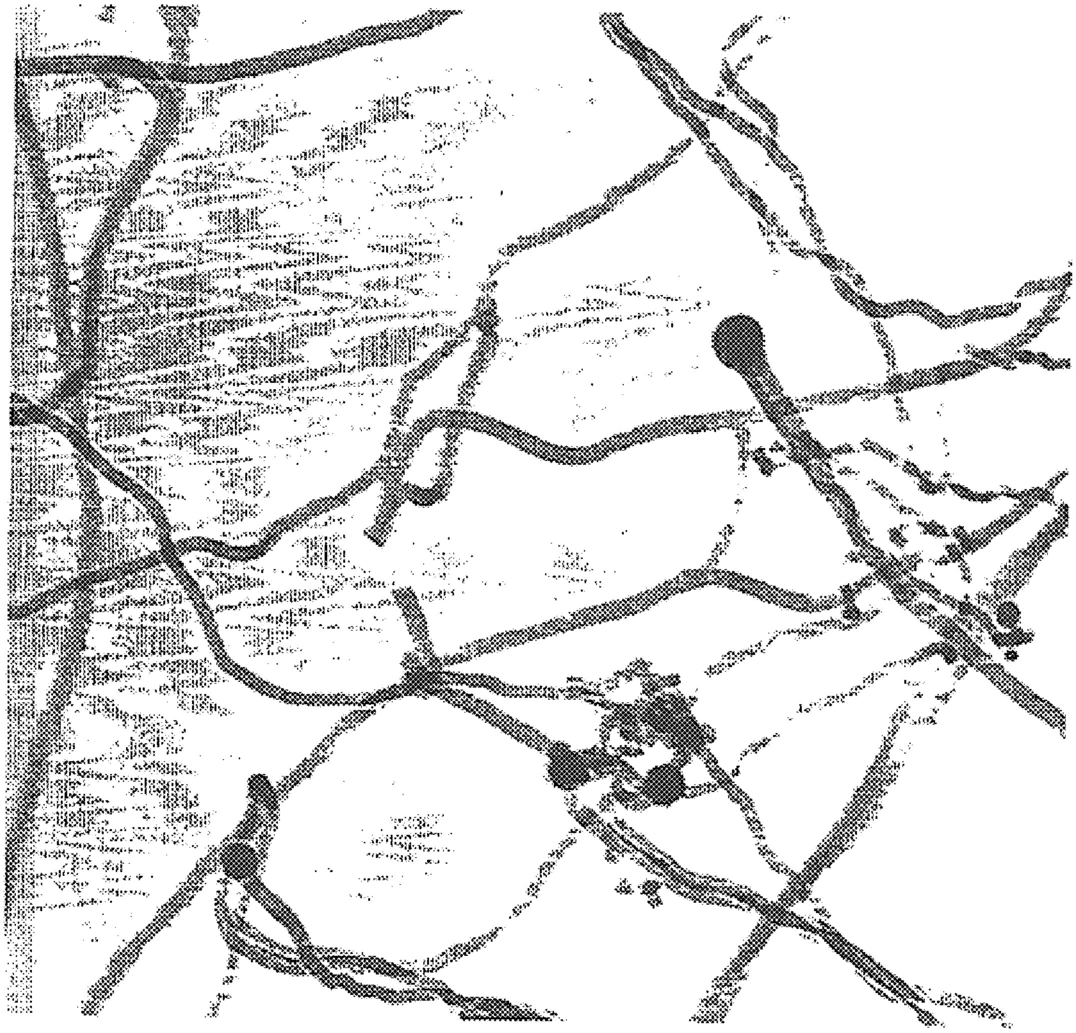
FIG. 22 is a TEM image of the silicon oxide nanowire shown in FIG. 21.
Figure 23:
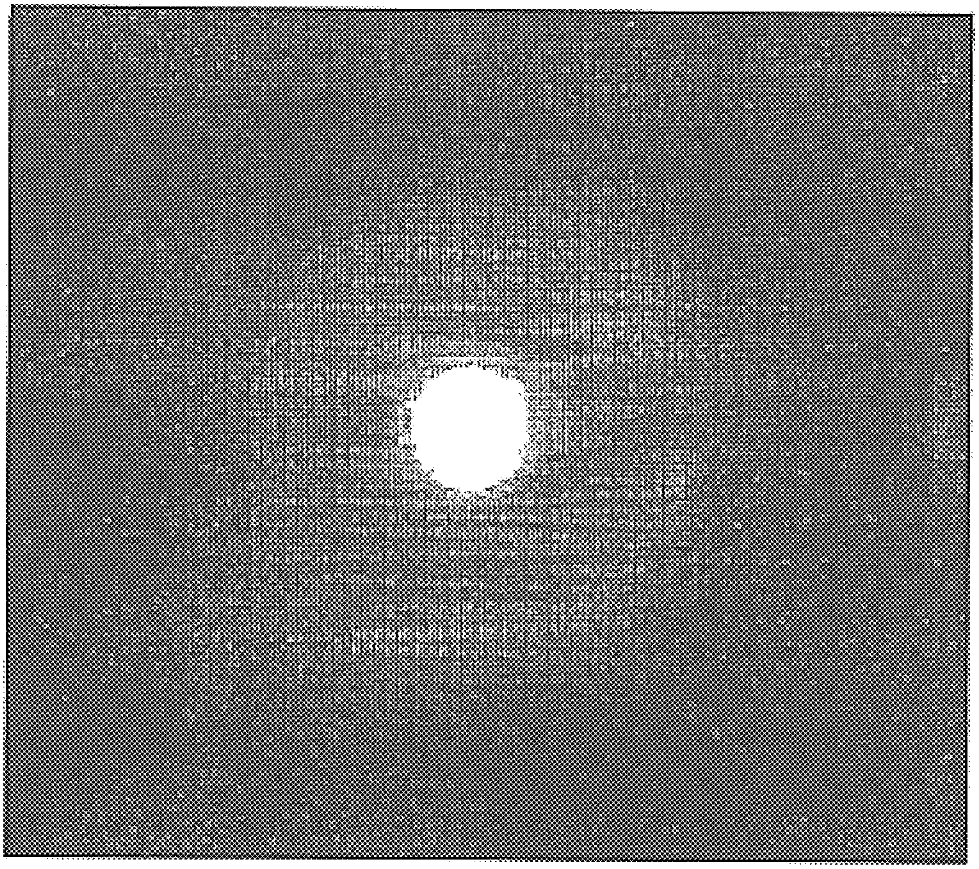
FIG. 23 is a TED pattern of the silicon oxide nanowire shown in FIG. 22.
Figure 24:
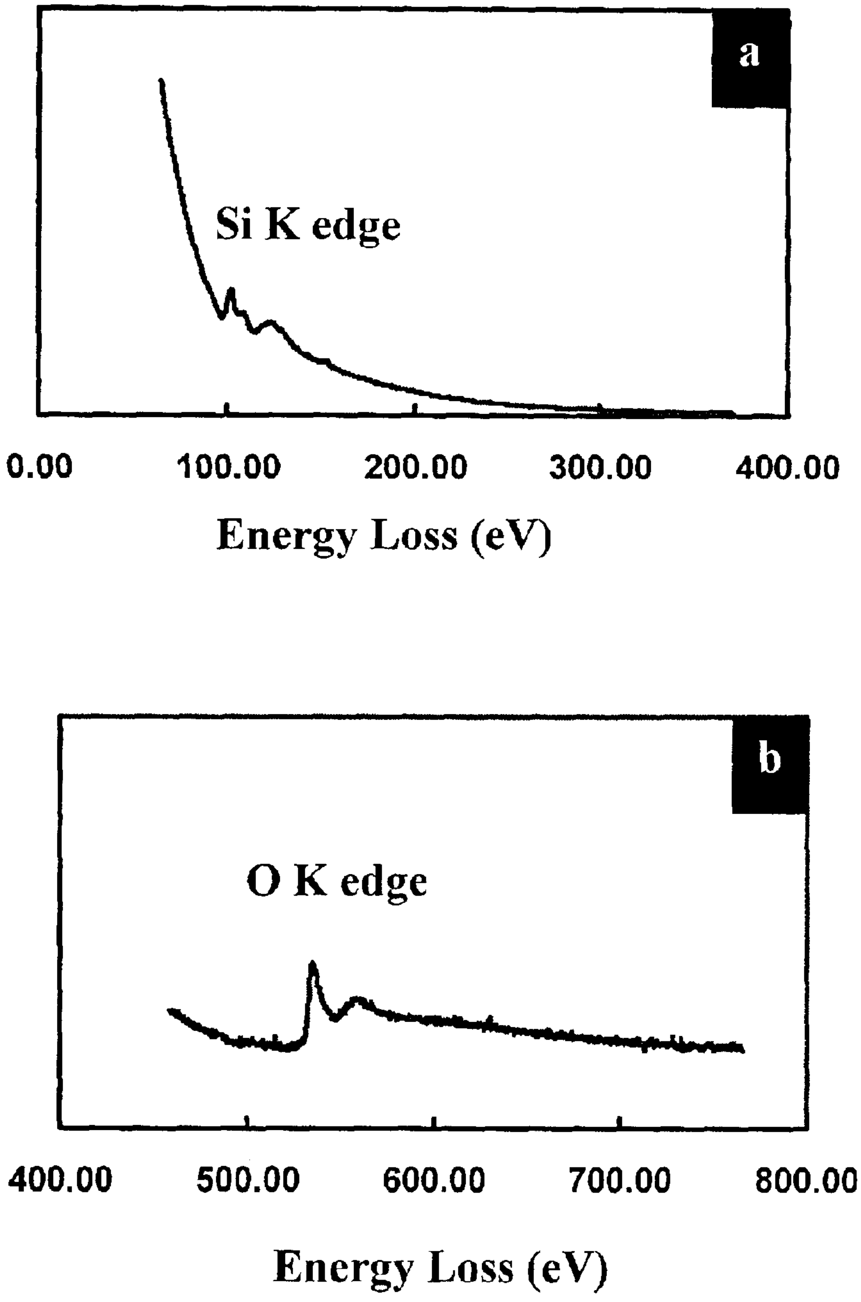
FIG. 24 is an electron energy loss spectroscopy (EELS) spectrum of the silicon oxide nanowire shown in FIG. 22, (a) silicon K edge; (b) oxygen K edge.

SEM micrograph (FIG. 21) shows that single nanowire grows on the tip of individual silicon cone. TEM image shows that the diameters of the nanowires range form 50–100 nm (FIG. 22). Transmission electron diffraction (TED) pattern in FIG. 23 shows that the nanowires are amorphous. Electron energy loss spectroscopy (EELS) confirms that the nanowires are composed of silicon (FIG. 24*a*) and oxygen (FIG. 24*b*). As the argon gas may contain certain amount of impurities, including oxygen, which leads to the oxidation of the silicon nanowires.

Example J

Figure 25:
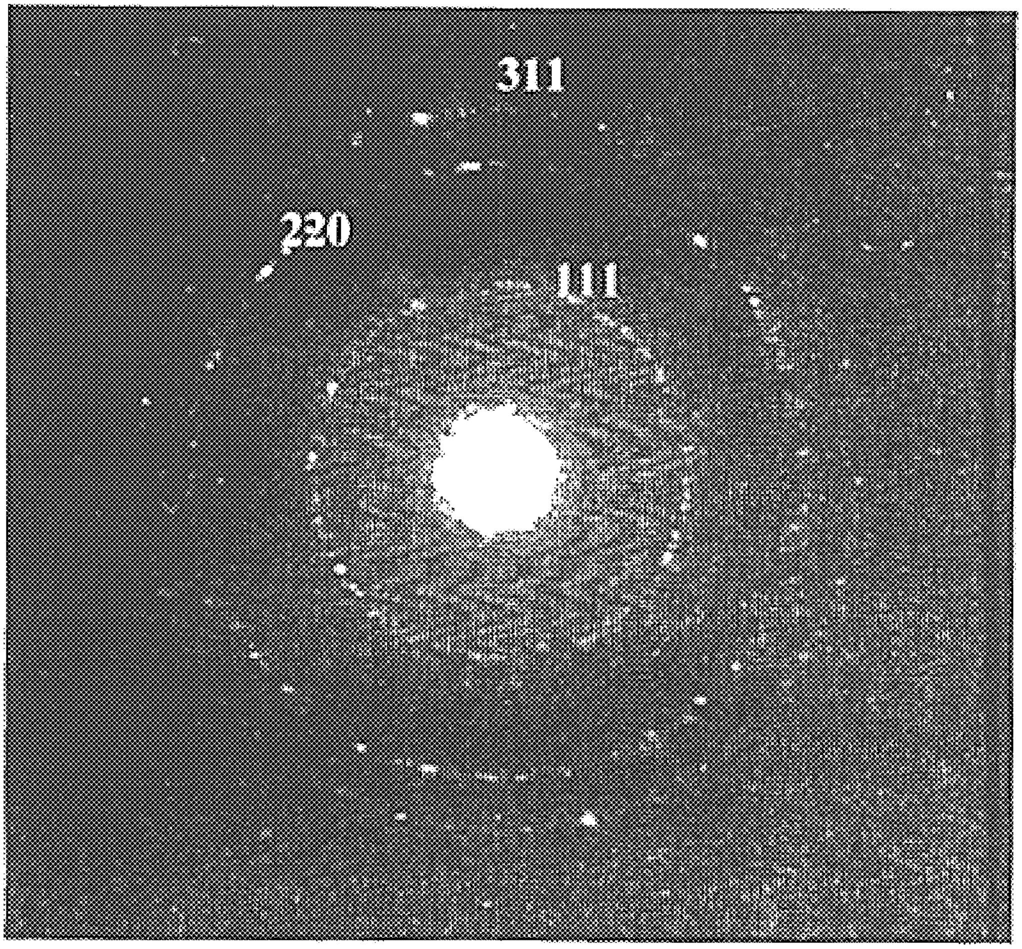
FIG. 25 is TED pattern of the silicon nanowires, which are grown on the tips of silicon cones, corresponding to example J.

In this example, the nanowires growth conditions are the same as in Example I, except that hydrogen was introduced together with argon during the growth process. The argon/hydrogen ratio is 1:0.2. The morphology of the as-grown nanowires on the cone tips is similar to that in example I. TED pattern in FIG. 25 shows that the nanowires are crystalline silicon.

What is claimed is:

1. A method for the synthesis of large area uniform silicon cone arrays on a substrate by ion-beam sputtering, wherein total pressure is kept at $2\times10^{-4}$ Torr, silicon is used as a substrate, and a metal is used as a catalyst.

2. A method as claimed in claim 1 wherein the ion-beam sputtering is carried out using a sputter gas that is selected from the group consisting of helium, neon, argon, xenon and hydrogen.

3. A method as claimed in claim 1 wherein the catalyst is selected from the group consisting of molybdenum, tungsten and nickel.

4. A method as claimed in claim 1 wherein the substrate temperature ranges from 100° C. to 600° C.

5. A method as claimed in claim 1 wherein the ion energy is maintained in the range of 100 eV to 1000 eV.

6. A method as claimed in claim 1 wherein the angle between the center of the ion-beam and the substrate surface normal ranges from 0 to 90 degrees.

7. A method as claimed in claim 1 wherein the fabrication time is between 30–240 minutes.

8. Apparatus for ion-beam sputtering of large area uniform silicon cones, comprising a high vacuum chamber suitable for ion-beam sputtering, an ion source, means for holding a substrate in the chamber, means for arranging a metal catalyst around the substrate, means for adjusting the substrate temperature, means for adjusting the angles between the center of the ion beam of said ion-beam sputtering and the substrate surface normal, and means for maintaining the vacuum chamber at an operating pressure of $2\times10^{-14}$ Torr.

9. A method for the synthesis of large area uniform cone arrays made of a first material by ion-beam sputtering, wherein the first material is used as a substrate, and a second material is used as a catalyst, wherein the first material is selected from a group consisting of germanium or graphite, wherein the second material is a metal.

10. Apparatus for ion-beam sputtering of large area uniform silicon cones, comprising a high vacuum chamber suitable for ion-beam sputtering, an ion-source, means for holding a substrate in the chamber, means for arranging a metal catalyst around the substrate, means for adjusting the substrate temperature and means for adjusting the angles between the center of the ion-beam of said ion-beam sputtering and the substrate surface normal.

11. Apparatus as claimed in claim 10 wherein the ion source is an rf ion source or a Kaufman ion-source.

12. Apparatus as claimed in claim 10 wherein said substrate holder means comprises a substrate holder clamp made of molybdenum, tungsten, or nickel.

* * * * *